(12) United States Patent
Nitta

(10) Patent No.: US 7,232,643 B2
(45) Date of Patent: Jun. 19, 2007

(54) POSITIVE RESIST COMPOSITION AND COMPOUND USED THEREIN

(76) Inventor: Kazuyuki Nitta, c/o Tokyo Ohka Kogyo Co., Ltd., 150, Nakamaruko, Nakahara-ku, Kawasaki-shi, Kanagawa-ken (JP)

( * ) Notice: Subject to any disclaimer, the term of this patent is extended or adjusted under 35 U.S.C. 154(b) by 204 days.

(21) Appl. No.: 11/137,164

(22) Filed: May 25, 2005

(65) Prior Publication Data

US 2005/0266340 A1    Dec. 1, 2005

(30) Foreign Application Priority Data

May 31, 2004    (JP)    ............ P 2004-161983

(51) Int. Cl.
*G03F 7/004* (2006.01)
(52) U.S. Cl. ................... 430/270.1; 524/303
(58) Field of Classification Search ............ 430/270.1; 524/303
See application file for complete search history.

(56) References Cited

U.S. PATENT DOCUMENTS

| 5,216,135 | A | 6/1993 | Urano et al. |
| 6,492,542 | B2 | 12/2002 | Miyagi et al. |
| 6,603,029 | B1 | 8/2003 | Shiomi et al. |
| 2002/0045123 | A1 | 4/2002 | Okubo et al. |

FOREIGN PATENT DOCUMENTS

| EP | 0 709 736 A1 | 5/1996 |
| JP | 4-211258 | 8/1992 |
| JP | 2006-206484 A * | 8/2006 |

| WO | WO 2006046383 A1 * | 5/2006 |

OTHER PUBLICATIONS

European Search Report from corresponding European Patent Application Serial No. EP 05 10 4527.

* cited by examiner

*Primary Examiner*—Amanda Walke
(74) *Attorney, Agent, or Firm*—Knobbe, Martens, Olson and Bear, LLP

(57) ABSTRACT

A positive resist composition includes a resin component (A) which contains an acid dissociable dissolution inhibiting group and displays increased alkali solubility under the action of acid, an acid generator component (B) that generates acid on exposure, and a compound (C) represented by a general formula (1) shown below:

(wherein, each $R_1$ group and each $R_3$ group represents, independently, a hydrogen atom, an alkyl group of 1 to 3 carbon atoms, or a cycloalkyl group of 4 to 6 carbon atoms, provided at least one of the $R_1$ and $R_3$ groups is a cycloalkyl group of 4 to 6 carbon atoms, n represents an integer from 1 to 3, $R_2$ represents an alkyl group of 1 to 3 carbon atoms, and X represents an alkylene group of either 4 or 5 carbon atoms).

12 Claims, 3 Drawing Sheets

POSITIVE RESIST COMPOSITION AND COMPOUND USED THEREIN

BACKGROUND OF THE INVENTION

1. Field of the Invention

The present invention relates to a positive resist composition and a compound used in the composition.

Priority is claimed on Japanese Patent Application No. 2004-161983, filed May 31, 2004, the content of which is incorporated herein by reference.

2. Description of Related Art

In recent years, in the production of semiconductor elements and liquid crystal display elements, advances in lithography techniques have lead to rapid progress in the field of miniaturization. Typically, these techniques for achieving further miniaturization involve shortening of the wavelength of the exposure light source. Until recently, ultraviolet radiation such as g-lines and i-lines had been used as the exposure light source, but nowadays, production using KrF excimer lasers (248 nm) is common, and even ArF excimer lasers (193 nm) are now starting to be introduced.

One example of a known resist material that satisfies the high resolution requirements needed to enable reproduction of a pattern with very minute dimensions is a chemically amplified resist composition, comprising a base resin that displays changed alkali solubility under the action of acid, and an acid generator that generates acid on exposure, dissolved in an organic solvent.

Chemically amplified positive resist compositions that have been proposed as ideal resist materials for exposure using KrF excimer laser lithography typically employ a polyhydroxystyrene-based resin, in which a portion of the hydroxyl groups have been protected with an acid dissociable, dissolution inhibiting group, as the base resin (for example, see patent reference 1).

Examples of the most commonly used acid dissociable, dissolution inhibiting groups include so-called acetal groups, including chain-like ether groups typified by 1-ethoxyethyl groups, and cyclic ether groups typified by tetrahydropyranyl groups, as well as tertiary alkyl groups typified by tert-butyl groups, and tertiary alkoxycarbonyl groups typified by tert-butoxycarbonyl groups.

(Patent Reference 1)
Japanese Unexamined Patent Application, First Publication No. Hei 4-211258

With the recent growing demands for ultra-fine, high resolution resist patterns, improvements in the level of resist pattern defects following developing (surface defects) are becoming increasingly important.

These defects refer to general resist pattern problems and irregularities detected by inspecting the developed resist pattern from directly overhead using a surface defect inspection apparatus, such as that manufactured by KLA Tencor Corporation (brand name "KLA"). Specific examples of these irregularities include post-developing scum (mainly undissolved residues), foam, dust, and bridging between sections of the resist pattern.

SUMMARY OF THE INVENTION

The present invention takes the above circumstances into consideration, with an object of providing technology that enables the suppression of defects within the developed resist pattern.

In order to achieve the above object, the present invention employs the aspects described below.

A first aspect of the present invention provides a positive resist composition including a resin component (A) which contains an acid dissociable dissolution inhibiting group and displays increased alkali solubility under the action of acid, an acid generator component (B) that generates acid on exposure, and a compound (C) represented by a general formula (1) shown below.

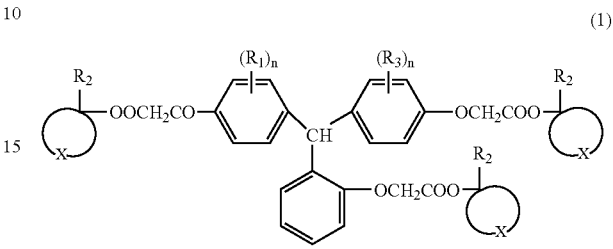

(1)

(wherein, each $R_1$ group and each $R_3$ group represents, independently, a hydrogen atom, an alkyl group of 1 to 3 carbon atoms, or a cycloalkyl group of 4 to 6 carbon atoms, provided at least one of the $R_1$ and $R_3$ groups is a cycloalkyl group of 4 to 6 carbon atoms, n represents an integer from 1 to 3, $R_2$ represents an alkyl group of 1 to 3 carbon atoms, and X represents an alkylene group of either 4 or 5 carbon atoms.)

A second aspect of the present invention is a compound represented by a general formula (2) shown below.

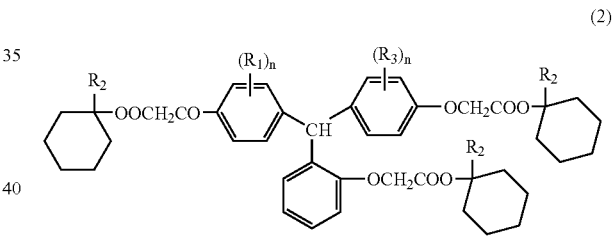

(2)

(wherein, each $R_1$ group and each $R_3$ group represents, independently, a hydrogen atom, an alkyl group of 1 to 3 carbon atoms, or a cycloalkyl group of 4 to 6 carbon atoms, provided at least one of the $R_1$ and $R_3$ groups is a cycloalkyl group of 4 to 6 carbon atoms, n represents an integer from 1 to 3, and $R_2$ represents an alkyl group of 1 to 3 carbon atoms.)

In this description, the term "(meth)acrylate" is a generic term meaning methacrylate and/or acrylate. The term "structural unit" refers to a monomer unit that contributes to the formation of a polymer.

According to the present invention, the occurrence of defects within developed resist patterns can be favorably suppressed.

DETAILED DESCRIPTION OF THE INVENTION

<Novel Compound>

Figure 1:
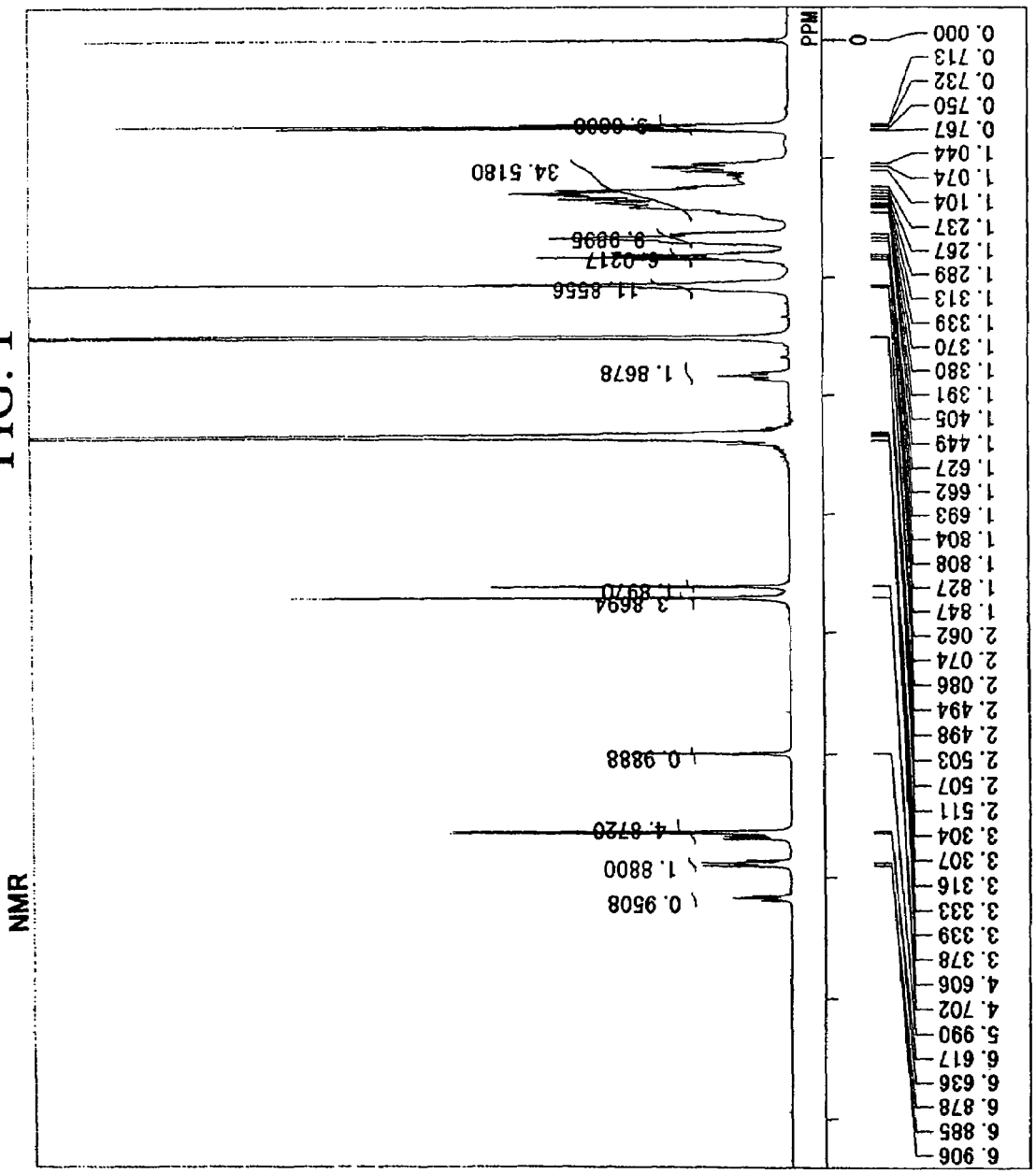
FIG. 1 is a chart showing the results of proton nuclear magnetic resonance analysis of an example according to the present invention.

First is a description of the novel compound of the present invention (hereafter, also referred to as compound (C1)). The compound (C1) is a tertiary cyclohexyl ester of a trisphenol trioxymethylcarboxylic acid.

The compound (C1) includes cycloalkyl groups containing a tertiary carbon atom, and these cycloalkyl groups dissociate readily in the presence of acid, generating an organic carboxylic acid. This compound (C1) is very useful within a chemically amplified resist composition, and can be used as a component containing bulky, acid dissociable, dissolution inhibiting groups (the aforementioned cyclohexyl groups) which dissociate readily in the presence of acid.

In the above general formula (2), each $R_1$ group and each $R_3$ group represents, independently, a hydrogen atom, an alkyl group of 1 to 3 carbon atoms, or a cycloalkyl group of 4 to 6 carbon atoms. n represents an integer from 1 to 3, and at least one of the $R_1$ and $R_3$ groups must be a cycloalkyl group of 4 to 6 carbon atoms. Compounds in which both the $R_1$ and $R_3$ groups include a cycloalkyl group of 4 to 6 carbon atoms are particularly preferred. Moreover, in a preferred compound, $R_1$ and $R_3$ are the same.

The alkyl groups of 1 to 3 carbon atoms of the groups $R_1$ and $R_3$ may be either straight chain, or branched chain groups. Specific examples include methyl groups, ethyl groups, n-propyl groups and isopropyl groups. Of these, methyl groups are preferred.

The cycloalkyl groups of 4 to 6 carbon atoms of the groups $R_1$ and $R_3$ are preferably cyclohexyl groups.

In those cases where n is either 2 or 3, there are no particular restrictions on the bonding positions of the substituent groups $R_1$ and $R_3$ on the benzene rings. n is preferably 2, and in such cases, the bonding positions of the two substituent groups R (or $R^3$) are preferably in a m-relationship or a p-relationship.

The alkyl groups of 1 to 3 carbon atoms of the group $R_2$ may be either straight chain, or branched chain groups. Specific examples include methyl groups, ethyl groups, n-propyl groups and isopropyl groups. Of these, the $R^2$ groups are preferably methyl groups or ethyl groups.

Specific examples of the compound (C1) include 1,1-di(5-cyclohexylphenyl-4-oxymethylcarboxy (1-methyl-cyclohexane))-1-(phenyl-2-oxymethylcarboxy(1-methyl-cyclohexane))methane, 1,1-di(2-cyclohexylphenyl-4-oxymethylcarboxy(1-methyl-cyclohexane))-1-(phenyl-2-oxymethylcarboxy(1-methyl-cyclohexane))methane, 1,1-di(2-methyl-5-cyclohexylphenyl-4-oxymethylcarboxy(1-methyl-cyclohexane))-1-(phenyl-2-oxymethylcarboxy(1-methyl-cyclohexane))methane, 1,1-di(3-methyl-5-cyclohexylphenyl-4-oxymethylcarboxy(1-methyl-cyclohexane))-1-(phenyl-2-oxymethylcarboxy(1-methyl-cyclohexane))methane, 1,1-di(2-ethyl-5-cyclohexylphenyl-4-oxymethylcarboxy(1-methyl-cyclohexane))-1-(phenyl-2-oxymethylcarboxy(1-methyl-cyclohexane))methane, 1,1-di(2-n-propyl-5-cyclohexylphenyl-4-oxymethylcarboxy(1-methyl-cyclohexane))-1-(phenyl-2-oxymethylcarboxy(1-methyl-cyclohexane))methane, 1,1-di(2-isopropyl-5-cyclohexylphenyl-4-oxymethylcarboxy(1-methyl-cyclohexane))-1-(phenyl-2-oxymethylcarboxy(1-methyl-cyclohexane))methane, 1,1-di(2-methyl-5-cyclohexylphenyl-4-oxymethylcarboxy(1-ethyl-cyclohexane))-1-(phenyl-2-oxymethylcarboxy(1-ethyl-cyclohexane))methane, 1,1-di(2-methyl-5-cyclohexylphenyl-4-oxymethylcarboxy(1-n-propyl-cyclohexane))-1-(phenyl-2-oxymethylcarboxy(1-n-propyl-cyclohexane))methane, and 1,1-di(2-methyl-5-cyclohexylphenyl-4-oxymethylcarboxy(1-isopropyl-cyclohexane))-1-(phenyl-2-oxymethylcarboxy(1-isopropyl-cyclohexane))methane.

Of these, a particularly preferred example of the compound (C1) is the compound represented by the chemical formula (3) shown below.

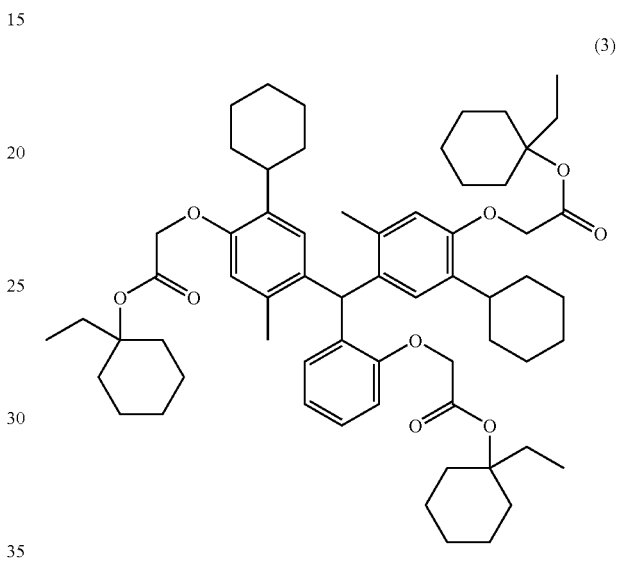

(3)

The compound (C1) can be produced using the type of synthesis described below.

First, a 1,1-di(4-hydroxyphenyl)-1-(2-hydroxyphenyl) methane derivative represented by a general formula (4) shown below (hereafter referred to as the starting compound) is dissolved in a suitable reaction solvent, and is then reacted with an alkyl ester of a halogenated acetic acid, and preferably a tertiary alkyl ester of a halogenated acetic acid, in the presence of an alkali catalyst, thus generating a tertiary alkyl ester of a trisphenol trioxymethylcarboxylic acid (intermediate 1).

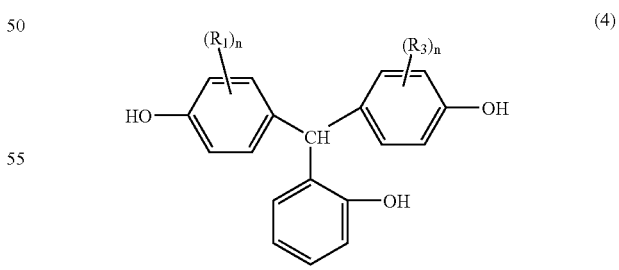

(4)

(wherein, $R_1$, $R_3$, and n are as defined for the general formula (2))

Specific examples of the starting compound represented by the general formula (4) include 1,1-di(4-hydroxy-5-cyclohexylphenyl)-1-(2-hydroxyphenyl)methane, 1,1-di(4-hydroxy-2-cyclohexylphenyl)-1-(2-hydroxyphenyl)methane, 1,1-di(2-methyl-4-hydroxy-5-cyclohexylphenyl)-1-(2-hydroxyphenyl)methane, 1,1-di(3-methyl-4-hydroxy-5-cyclohexylphenyl)-1-(2-hydroxyphenyl)methane, 1,1-di(2-ethyl-4-hydroxy-5-cyclohexylphenyl)-1-(2-hydroxyphenyl)methane, 1,1-di(2-n-propyl-4-hydroxy-5-cyclohexylphenyl)-1-(2-hydroxyphenyl)methane, and 1,1-di(2-isopropyl-4-hydroxy-5-cyclohexylphenyl)-1-(2-hydroxyphenyl)methane.

Furthermore, examples of the aforementioned alkyl ester of a halogenated acetic acid include n-propyl chloroacetate, t-butyl bromoacetate, t-butyl chloroacetate, and n-hexyl bromoacetate. Of these, tertiary alkyl esters of halogenated acetic acids are preferred, and t-butyl bromoacetate and t-butyl chloroacetate are particularly desirable.

During the production of the intermediate 1, in the initial reaction between the starting material represented by the general formula (4) and the tertiary alkyl ester of a halogenated acetic acid, the tertiary alkyl ester of a halogenated acetic acid is typically added in a quantity within a range from 3 to 6 mols, and preferably from 3.5 to 5,5 mols, per 1 mol of the starting material.

Examples of the alkali catalyst used in the above reaction include sodium carbonate, potassium carbonate, and sodium hydroxide. This alkali catalyst is typically added in a quantity equivalent to between 3 and 6 mols, and preferably from 4 to 5 mols, per 1 mol of the starting material.

The reaction solvent should be selected with due consideration given to factors such as the raw materials used in the reaction, the solubility of the reaction product, the reaction conditions, and economic factors. Dimethylformamide is a preferred solvent. The quantity of the reaction solvent is typically within a range from 200 to 600 parts by weight, and preferably from 300 to 400 parts by weight, per 100 parts by weight of the starting material.

The reaction can be conducted, for example, by combining the starting material, the alkali catalyst, and the solvent in a reaction vessel, stirring the resulting mixture under a stream of nitrogen, at a temperature of 70 to 90° C., and preferably from 75 to 80° C., subsequently adding the tertiary alkyl ester of a halogenated acetic acid dropwise to the solution, and then continuing the stirring to complete the reaction. Under these reaction conditions, the reaction can usually be completed in approximately 5 to 7 hours.

Following completion of the reaction, the alkali salt is removed from the reaction product mixture by filtration or the like. The reaction product can then be either supplied, as is, to the subsequent hydrolysis reaction, or purified by washing with water, followed by either crystallization or precipitation, before being supplied to the subsequent hydrolysis reaction.

Subsequently, the intermediate 1 is subjected to hydrolysis in the presence of an acid catalyst, thus yielding a trisphenol trioxymethylcarboxylic acid (intermediate 2).

There are no particular restrictions on the method employed for this hydrolysis reaction, and one suitable method is described below.

Namely, the intermediate 1 obtained from the above reaction, an acid catalyst, and a reaction solvent are combined in a reaction vessel, and the resulting mixture is then stirred under a stream of nitrogen, at a temperature of 80 to 100° C., and preferably from 85 to 95° C., to effect the hydrolysis reaction.

As the acid catalyst used in this reaction, para-toluenesulfonic acid and benzenesulfonic acid and the like can be favorably used. Para-toluenesulfonic acid is particularly desirable. The quantity used of this acid catalyst is typically within a range from 0.8 to 1.1 mols, and preferably from 0.9 to 1.0 mols, per 1 mol of the intermediate 1.

Furthermore, the reaction solvent should be selected with due consideration given to factors such as the raw materials used in the reaction, the solubility of the reaction product, the reaction conditions, and economic factors. Methyl isobutyl ketone is a preferred solvent.

The quantity of the reaction solvent is typically within a range from 150 to 300 parts by weight, and preferably from 150 to 200 parts by weight, per 100 parts by weight of the intermediate 1.

Under these types of reaction conditions, the reaction can usually be completed in approximately 7 to 10 hours.

Following completion of the reaction, the reaction product mixture can be purified by usual methods. For example, the intermediate 2 (trisphenol trioxymethylcarboxylic acid) can be obtained with good purity by washing the crude reaction product mixture with water, separating and discarding the water layer, and then adding a suitable solvent such as cyclohexane or toluene to the organic phase to precipitate the product, which can then be filtered off and dried.

Subsequently, using the thus obtained intermediate 2, a compound (C1) is synthesized in the following manner, using the method disclosed in Japanese Unexamined Patent Application, First Publication No. 2002-138067.

First, the intermediate 2 and a 1-alkyl substituted cyclohexan-1-ol as a tertiary alcohol are combined to form a mixture, an esterifying agent with a monovalent acid group is added sequentially to the mixture, preferably in the presence of a tertiary amide catalyst, and an esterification reaction is conducted to generate the compound (C1).

In this esterification reaction, a base is usually employed to capture the acid generated by the esterifying agent.

Specific examples of the 1-alkyl substituted cyclohexan-1-ol used in the present invention include 1-methylcyclohexan-1-ol, 1-ethylcyclohexan-1-ol, 1-n-propylcyclohexan-1-ol, and 1-isopropylcyclohexan-1-ol.

The quantity added of this 1-alkyl substituted cyclohexan-1-ol is typically within a range from 3 to 6 mols, and preferably from 3.5 to 4 mols, per 1 mol of the intermediate 2.

Examples of the esterifying agent with a monovalent acid group used in the above reaction include aromatic sulfonyl chlorides such as p-toluenesulfonyl chloride, and aliphatic sulfonyl chlorides such as methanesulfonyl chloride. The quantity used of this type of esterifying agent is typically within a range from 1 to 5 mols, and preferably from 3 to 5 mols, per 1 mol of the intermediate 2.

Examples of tertiary amide catalysts that can be used include dimethylacetamide, dimethylformamide, diethylacetamide, diethylformamide, and N-methylpyrrolidone. The quantity used of this catalyst is typically within a range from 0.01 to 30 parts by weight, and preferably from 0.1 to 5 parts by weight, per 100 parts by weight of the intermediate 2.

Furthermore, in the above production method, during the esterification reaction, a base is usually employed to capture the acid generated from the esterifying agent with a monovalent acid group, which can undergo a transesterification with the tertiary alcohol. There are no particular restrictions on the base used, and suitable examples include triethylamine, pyridine, and potassium carbonate, although of these, pyridine is preferred. The quantity used of this base is typically within a range from 2.0 to 50 mols, and preferably from 2.0 to 30 mols per 1 mol of the intermediate 2.

The reaction temperature is typically within a range from 30 to 80° C., and preferably from 40 to 60° C. There are no particular restrictions on the reaction pressure, which is typically within a range from 100 to 1000 kPa, and preferably from 100 to 300 kPa. Under these types of reaction conditions, the reaction can usually be completed in approximately 1 to 20 hours. The end point of the esterification reaction can be confirmed using analysis by either liquid chromatography (HPLC), or gas chromatography (GC).

The reaction is typically conducted by combining the intermediate 2 and the tertiary alcohol in a reaction vessel, heating the mixture to a temperature of 40 to 60° C., adding the esterifying agent gradually, by dripping or the like, over a period of 0.5 to 10 hours, and then allowing the reaction to proceed. The entire quantity of the catalyst such as dimethylacetamide may be added to either the mixture of the intermediate 2 and the tertiary alcohol, or the esterifying agent, or alternatively, the catalyst may be divided into two portions, and added to both components. Similarly, the base may be added to either the mixture of the intermediate 2 and the tertiary alcohol, or the esterifying agent, or may also be divided into two portions, and added to both components.

In the above reaction, a solvent may be used if desired. The solvent is preferably a non-alcoholic organic solvent, and examples of suitable solvents include aromatic solvents such as toluene, ketone solvents, and ether solvents. Furthermore, the catalyst such as dimethylacetamide, or the base such as pyridine, may also be used as the solvent.

Following completion of the reaction, the reaction product mixture is neutralized using an aqueous alkali solution such as tetramethylammonium hydroxide, the aqueous phase is separated and discarded, and the solvent is removed from the remaining organic phase by distillation or the like, yielding a compound (C1) of the present invention.

The reaction temperature and other reaction conditions such as the relative quantities of the reactants, can be appropriately modified if required.

Next is a description of a positive resist composition of the present invention.

<Resist Composition>

A positive resist composition of the present invention includes a resin component (A) (hereafter referred to as the component (A)), which contains an acid dissociable, dissolution inhibiting group, and displays increased alkali solubility under the action of acid, an acid generator component (B) (hereafter referred to as the component (B)) that generates acid on exposure, and a compound (C) (hereafter referred to as the component (C)) represented by the chemical formula (1) shown above.

When acid is generated from the component (B) on exposure, and this acid acts on the component (A), the acid dissociable, dissolution inhibiting groups within the component (A) dissociate, causing the entire component (A) to change from an alkali insoluble state to an alkali soluble state.

The component (C) contains three acid dissociable, dissolution inhibiting groups, and the action of the acid generated from the component (B) also causes these acid dissociable, dissolution inhibiting groups to dissociate, generating an organic carboxylic acid.

Accordingly, when a resist is exposed through a mask pattern during the formation of a resist pattern, or alternatively, is exposed and then subjected to a post exposure baking treatment, the exposed portions of the resist shift to an alkali soluble state, whereas the unexposed portions remain insoluble in alkali, meaning that alkali developing can then be used to form a positive resist pattern.

Component (A)

In a positive resist composition of the present invention, there are no particular restrictions on the component (A),
provided it contains an acid dissociable, dissolution inhibiting group, and displays increased alkali solubility under the action of acid, and for example, any of the resin components used in chemically amplified positive resist compositions for use with KrF excimer lasers are suitable. Specific examples include (a) polyhydroxystyrene resin components in which a portion of the hydroxyl groups have been substituted with acid dissociable, dissolution inhibiting groups, and (b) resin components formed from copolymers including a structural unit derived from (meth)acrylic acid, in which the hydrogen atom of the carboxyl group has been substituted with an acid dissociable, dissolution inhibiting group, a structural unit derived from hydroxystyrene and represented by a general formula (I) shown below, and/or a structural unit derived from styrene and represented by a general formula (II) shown below.

Furthermore, the resin component (a) described above may also contain other structural units, such as a structural unit derived from styrene and represented by a general formula (II) shown below.

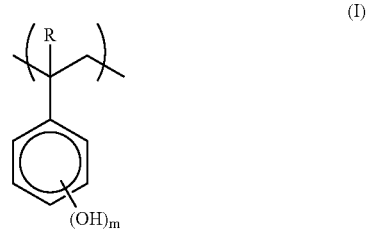

(I)

In the above general formula (I), R represents a hydrogen atom or a methyl group, although a hydrogen atom is preferred. The bonding position of the hydroxyl group may be the o-position, the m-position or the p-position, although from the viewpoints of availability and cost, the p-position is preferred. m represents an integer from 1 to 3, and is preferably 1.

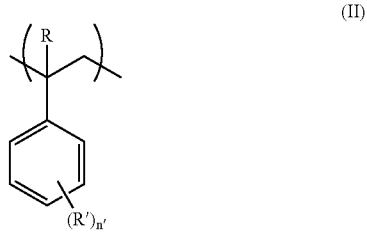

(II)

In the above general formula (II), R represents a hydrogen atom or a methyl group, although a hydrogen atom is preferred.

R' is a straight chain or branched alkyl group of 1 to 5 carbon atoms, and suitable examples include a methyl group, ethyl group, propyl group, isopropyl group, n-butyl group, isobutyl group, tert-butyl group, pentyl group, isopentyl group, or neopentyl group. From an industrial viewpoint, a methyl group or ethyl group is preferred.

The value of n' in the formula is either 0, or an integer from 1 to 3, although n' is preferably either 0 or 1, and in terms of industrial availability, is most preferably 0.

If n' is a value from 1 to 3, then the bonding position of the substituent group R' may be the o-position, the m-position or the p-position, and if n' is either 2 or 3, then any combination of substituent positions can be used.

As the acid dissociable, dissolution inhibiting group, any of the multitude of groups that have been proposed for use within conventional chemically amplified positive resist compositions for use with KrF excimer lasers can be used.

Specific examples of the acid dissociable, dissolution inhibiting group include tertiary alkyl groups, chain-like alkoxyalkyl groups, tertiary alkyloxycarbonyl groups, tertiary alkyloxycarbonylalkyl groups, and cyclic ether groups.

Specific examples of suitable tertiary alkyl groups include chain-like tertiary alkyl groups such as tert-butyl groups and tert-amyl groups, as well as tertiary alkyl groups containing a polycyclic alicyclic hydrocarbon group, such as 2-methyl-adamantyl groups and 2-ethyl-adamantyl groups.

Specific examples of suitable chain-like alkoxyalkyl groups include 1-ethoxyethyl groups, 1-methoxymethyl-ethyl groups, 1-isopropoxyethyl groups, 1-methoxypropyl groups, and 1-n-butoxyethyl groups.

Specific examples of suitable tertiary alkyloxycarbonyl groups include tert-butyloxycarbonyl groups and tert-amyloxycarbonyl groups.

Specific examples of suitable tertiary alkyloxycarbonylalkyl groups include tert-butyloxycarbonylmethyl groups and tert-amyloxycarbonylmethyl groups.

Specific examples of suitable cyclic ether groups include tetrahydropyranyl groups and tetrahydrofuranyl groups.

Of these, chain-like alkoxyalkyl groups, tertiary alkyloxycarbonyl groups, and cyclic ether groups can be favorably employed in the aforementioned resin component (a). Chain-like alkoxyalkyl groups are particularly desirable.

In the aforementioned resin component (b), tertiary alkyl groups are preferred.

There are no particular restrictions on the weight average molecular weight (the polystyrene equivalent molecular weight determined by gel permeation chromatography) of the resin of the component (A), although values within a range from 5,000 to 30,000 are preferred, and values from 8,000 to 20,000 are particularly desirable.

Component (B)

The component (B) can use any of the materials typically used as acid generators in conventional chemically amplified resist compositions, and there are no particular restrictions.

Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes, poly(bis-sulfonyl)diazomethanes, and diazomethane nitrobenzyl sulfonates, iminosulfonate-based acid generators, and disulfone-based acid generators.

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, and tri(4-tert-butyl)phenylsulfonium trifluoromethanesulfonate, heptafluoropropanesulfonate or nonafluorobutanesulfonate.

Specific examples of suitable oxime sulfonate-based acid generators include α-(methyl sulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile. Of these, α-(methylsulfonyloxyimino)-p-methoxyphenylacetonitrile is preferred.

Amongst the possible diazomethane-based acid generators, specific examples of bisalkyl or bisaryl sulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (compound A, decomposition point 135° C.), 1,4-bis(phenylsulfonyldiazomethylsulfonyl)butane (compound B, decomposition point 147° C.), 1,6-bis(phenylsulfonyldiazomethylsulfonyl)hexane (compound C, melting point 132° C., decomposition point 145° C.), 1,10-bis(phenylsulfonyldiazomethylsulfonyl)decane (compound D, decomposition point 147° C.), 1,2-bis(cyclohexylsulfonyldiazomethylsulfonyl)ethane (compound E, decomposition point 149° C.), 1,3-bis(cyclohexylsulfonyldiazomethylsulfonyl)propane (compound F, decomposition point 153° C.), 1,6-bis(cyclohexylsulfonyldiazomethylsulfonyl)hexane (compound G, melting point 109° C., decomposition point 122° C.), and 1,10-bis(cyclohexylsulfonyldiazomethylsulfonyl)decane (compound H, decomposition point 116° C.).

COMPOUND A

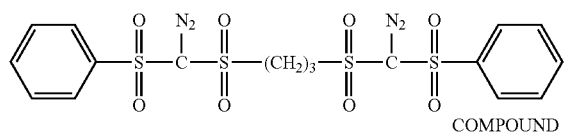

COMPOUND B

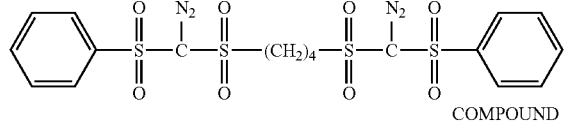

COMPOUND C

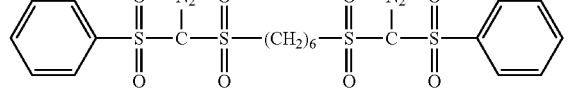

-continued

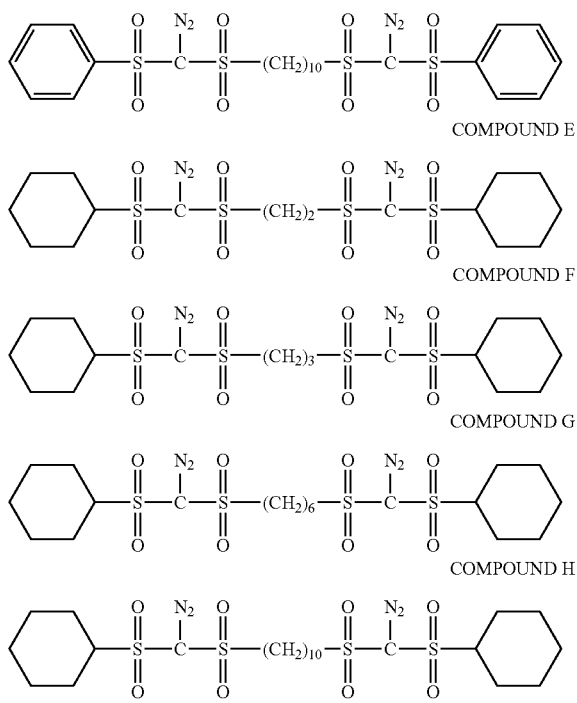

groups include a cycloalkyl group of 4 to 6 carbon atoms are particularly preferred. Moreover, in a preferred compound, $R_1$ and $R_3$ are the same.

The alkyl groups of 1 to 3 carbon atoms of the groups $R_1$ and $R_3$ may be either straight chain, or branched chain groups. Specific examples include methyl groups, ethyl groups, n-propyl groups and isopropyl groups. Of these, methyl groups are preferred.

The cycloalkyl groups of 4 to 6 carbon atoms of the groups $R_1$ and $R_3$ are preferably cyclohexyl groups.

In those cases where n is either 2 or 3, there are no particular restrictions on the bonding positions of the substituent groups $R_1$ and $R_3$ on the benzene rings. n is preferably 2, and in such cases, the bonding positions of the two substituent groups $R_1$ (or $R_3$) are preferably in a m-relationship or a p-relationship.

The alkyl groups of 1 to 3 carbon atoms of the group $R_2$ may be either straight chain, or branched chain groups. Specific examples include methyl groups, ethyl groups, n-propyl groups and isopropyl groups. Of these, the $R_2$ groups are preferably methyl groups or ethyl groups.

The group X represents an alkylene group of either 4 or 5 carbon atoms. Specifically, X is a straight chain alkylene group, which, in combination with the carbon atom to which the $R_2$ group is bonded, forms a cyclopentyl group or a cyclohexyl group.

As the component (C), compounds (C1) represented by the above general formula (2), or compounds (C2) represented by a general formula (5) shown below, are preferred.

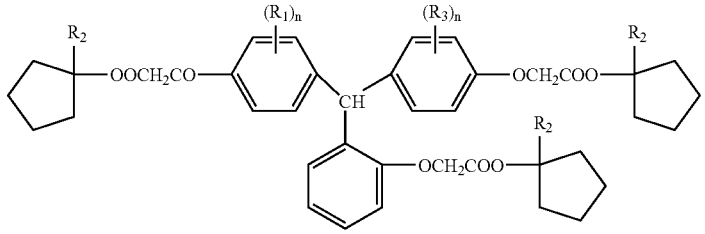

(5)

The acid generator of the composition (B) can be used alone, or in combinations of two or more different compounds.

The quantity of the component (B) within a positive resist composition of the present invention is typically within a range from 0.5 to 30 parts by weight, and preferably from 1 to 10 parts by weight, per 100 parts by weight of the component (A). If the quantity is lower than the above range, then there is a danger that pattern formation may not progress satisfactorily, whereas if the quantity exceeds the above range it becomes difficult to achieve a uniform solution, and there is also a danger of a deterioration in the storage stability of the composition.

Component (C)

In a compound (C) represented by the aforementioned general formula (1), each $R_1$ group and each $R_3$ group represents, independently, a hydrogen atom, an alkyl group of 1 to 3 carbon atoms, or a cycloalkyl group of 4 to 6 carbon atoms, provided at least one of the $R_1$ and $R_3$ groups is a cycloalkyl group of 4 to 6 carbon atoms, and n represents an integer from 1 to 3. Compounds in which both the $R_1$ and $R_3$ A compound (C1) is a compound represented by the above general formula (1), wherein X forms a cyclohexyl group in combination with the carbon atom to which the $R_2$ group is bonded, namely, a tertiary cyclohexyl ester of a trisphenol trioxymethylcarboxylic acid. The compound (C2) is also a compound represented by the above general formula (1), wherein X forms a cyclopentyl group in combination with the carbon atom to which the $R_2$ group is bonded, namely, a tertiary cyclopentyl ester of a trisphenol trioxymethylcarboxylic acid.

In the compounds (C1) and (C2), $R_1$, $R_2$, $R_3$, and n are the same as $R_1$, $R_2$, $R_3$, and n defined in relation to the compound (C).

Specific examples, and preferred examples of the compound (C1) are as described above.

Specific examples of the compound (C2) include 1,1-di(5-cyclohexylphenyl-4-oxymethylcarboxy(1-methyl-cyclopentane))-1-(phenyl-2-oxymethylcarboxy(1-methyl-cyclopentane))methane, 1,1-di(2-cyclohexylphenyl-4-oxymethylcarboxy(1-methyl-cyclopentane))-1-(phenyl-2-oxymethylcarboxy(1-methyl-cyclopentane))methane, 1,1-di (2-methyl-5-cyclohexylphenyl-4-oxymethylcarboxy(1-methyl-cyclopentane))-1-(phenyl-2-oxymethylcarboxy(1-methyl-cyclopentane))methane, 1,1-di(3-methyl-5-cyclohexylphenyl-4-oxymethylcarboxy(1-methyl-cyclopentane))-1-(phenyl-2-oxymethylcarboxy(1-methyl-cyclopentane))methane, 1,1-di(2-ethyl-5-cyclohexylphenyl-4-oxymethylcarboxy(1-methyl-cyclopentane))-1-(phenyl-2-oxymethylcarboxy(1-methyl-cyclopentane))methane, 1,1-di(2-n-propyl-5-cyclohexylphenyl-4-oxymethylcarboxy(1-methyl-cyclopentane))-1-(phenyl-2-oxymethylcarboxy(1-methyl-cyclopentane))methane, 1,1-di(2-isopropyl-5-cyclohexylphenyl-4-oxymethylcarboxy(1-methyl-cyclopentane))-1-(phenyl-2-oxymethylcarboxy(1-methyl-cyclopentane))methane, 1,1-di(2-methyl-5-cyclohexylphenyl-4-oxymethylcarboxy(1-ethyl-cyclopentane))-1-(phenyl-2-oxymethylcarboxy(1-ethyl-cyclopentane))methane, 1,1-di(2-methyl-5-cyclohexylphenyl-4-oxymethylcarboxy(1-n-propyl-cyclopentane))-1-(phenyl-2-oxymethylcarboxy(1-n-propyl-cyclopentane))methane, and 1,1-di(2-methyl-5-cyclohexylphenyl-4-oxymethylcarboxy(1-isopropyl-cyclopentane))-1-(phenyl-2-oxymethylcarboxy(1-isopropyl-cyclopentane))methane.

Of these, a particularly preferred example of the compound (C2) is the compound represented by the chemical formula (6) shown below.

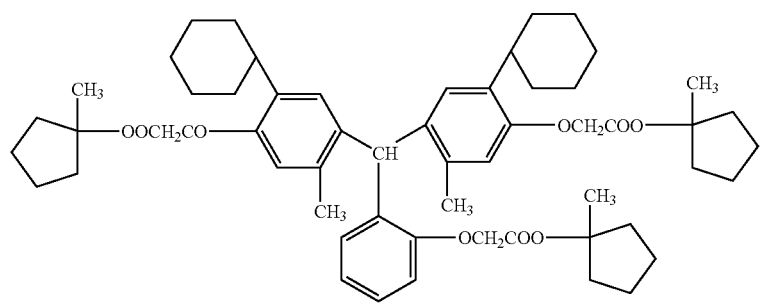

(6)

The compound (C2) can be produced using the same production method as that described above for the compound (C1), with the exception of replacing the 1-alkyl substituted cyclohexan-1-ol used in the esterification reaction of the intermediate 2 with a 1-alkyl substituted cyclopentan-1-ol.

In a positive resist composition of the present invention, the component (C) may use either a single compound, or a combination of two or more different compounds.

The blend ratio of the component (C) within the resist composition is typically within a range from 0.1 to 20 parts by weight, and preferably from 0.5 to 10 parts by weight, per 100 parts by weight of the component (A). By ensuring this quantity is at least 0.1 parts by weight, the occurrence of defects can be effectively suppressed, whereas ensuring the quantity is no more than 20 parts by weight is preferable in terms of cost.

Organic Solvent

A positive resist composition according to the present invention can be produced by dissolving the aforementioned components (A), (B) and (C), together with any of the optional components described below, in an organic solvent.

The organic solvent may be any solvent capable of dissolving the various components to generate a uniform solution, and one or more solvents selected from known materials used as the solvents for conventional chemically amplified resists can be used.

Specific examples of the solvent include ketones such as γ-butyrolactone, acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methylpyruvate, ethyl pyruvate, methyl methoxypropionate, and ethyl ethoxypropionate.

These organic solvents can be used alone, or as a mixed solvent containing two or more different solvents.

Of the above solvents, solvents comprising at least one of propylene glycol monomethyl ether acetate (PGMEA), propylene glycol monomethyl ether (PGME), and ethyl lactate (EL) are preferred.

Furthermore, mixed solvents of propylene glycol monomethyl ether acetate (PGMEA) and a polar solvent are preferred. The blend ratio in such a mixed solvent should be determined with due consideration given to factors such as the co-solubility of PGMEA and the polar solvent, but is preferably within a range from 1:9 to 8:2, and even more preferably from 2:8 to 7:3.

More specifically, in those cases where EL is added as the polar solvent, the weight ratio of PGMEA:EL is preferably within a range from 2:8 to 7:3, and even more preferably from 3:7 to 6.5:3.5.

Furthermore, mixed solvents containing at least one of PGMEA and EL, together with γ-butyrolactone, are also preferred as the organic solvent. In such cases, the weight ratio of the former and latter components in the mixed solvent is preferably within a range from 70:30 to 95:5.

There are no particular restrictions on the quantity used of the organic solvent, and this quantity can set in accordance with factors such as achieving a concentration that enables favorable application of the composition to a substrate or the like, and achieving the desired coating thickness. Typically, the quantity is sufficient to generate a solid fraction concentration for the resist composition within a range from 2 to 20% by weight, and preferably from 5 to 15% by weight.

Nitrogen-Containing Organic Compound (D) (Hereafter Referred to as Component (D))

In a positive resist composition of the present invention, in order to improve the resist pattern shape and the post exposure stability of the latent image formed by the pattern-wise exposure of the resist layer, a nitrogen-containing organic compound (D) can also be added as a separate, optional component.

A multitude of these nitrogen-containing organic compounds have already been proposed, and any of these known compounds can be used as the component (D), although an amine, and particularly a secondary aliphatic amine or a tertiary aliphatic amine, is preferred.

Specific examples of the component (D) include alkyl amines such as trimethylamine, diethylamine, triethylamine, di-n-propylamine, tri-n-propylamine, tripentylamine, tri-n-heptylamine, tri-n-octylamine, di-n-heptylamine, di-n-octylamine, and tri-n-dodecylamine; and alkylalcohol amines such as diethanolamine, triethanolamine, diisopropanolamine, triisopropanolamine, di-n-octanolamine, and tri-n-octanolamine. Of these, secondary or tertiary aliphatic amines containing an alkyl group of 7 to 15 carbon atoms are preferred. By ensuring that the component contains an alkyl group of 7 to 15 carbon atoms, the dispersion of the aliphatic amine through the resist pattern is suppressed, enabling a more uniform distribution. In the present invention, alkyl amines such as tri-n-octylamine and tri-n-dodecylamine are preferred.

These compounds may be used alone, or in combinations of two or more different compounds.

This component (D) is typically added in a quantity within a range from 0.01 to 5.0 parts by weight per 100 parts by weight of the component (A).

Acid Component (E) (Hereafter Referred to as the Component (E))

Furthermore, in order to prevent any deterioration in sensitivity caused by the addition of the aforementioned component (D), and improve the resist pattern shape and the post exposure stability of the latent image formed by the pattern-wise exposure of the resist layer, an acid component (hereafter referred to as the component (E)) comprising an organic carboxylic acid, or a phosphorus oxo acid or derivative thereof can also be added as another optional component (E). Either one, or both of the component (D) and the component (E) can be used.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Other Optional Components

Other miscible additives can also be added to a positive resist composition of the present invention according to need, and examples include additive resins for improving the properties of the resist film, surfactants for improving the ease of application, plasticizers, stabilizers, colorants, and halation prevention agents. Conventional dyes may also be added.

Method of Forming a Resist Pattern

Next is a description of a method of forming a resist pattern of the present invention.

First, a positive resist composition of the present invention is applied to the surface of a substrate such as a silicon wafer using a spinner or the like, and a prebake is then conducted. Following selective exposure of the coating film of the positive resist composition through a desired mask pattern using an exposure apparatus or the like, PEB (post exposure baking) is conducted. Subsequently, developing is conducted using an alkali developing solution, a rinse treatment is conducted to wash away and remove any developing solution left on the surface of the substrate, together with those sections of the resist composition that have dissolved in the developing solution, and the resist is then dried.

These steps can be conducted using known techniques. The operational conditions and the like can be selected appropriately in accordance with the makeup and characteristics of the positive resist composition that is used.

The exposure is preferably conducted using a KrF excimer laser, although compositions of the present invention can also be used with electron beam resists and EUV (extreme ultraviolet light).

A postbake step may also be included following the alkali developing step, and an organic or inorganic anti-reflective film may also be provided between the substrate and the applied layer of the resist composition. The postbake conditions typically employ a temperature of 90 to 150° C. for a period of 30 to 90 seconds.

A positive resist composition of the present invention can reduce the occurrence of resist pattern defects, and also enables a higher level of sensitivity to be achieved.

The defect suppression effect provided by the present invention can be confirmed by inspecting the developed resist pattern using either a SEM (scanning electron microscope) or a developing defects inspection apparatus, and checking for the presence of developing residues, microbridges, and other defects.

EXAMPLE 1

Synthesis of the Compound Represented by the Chemical Formula (3)

Synthesis of the Intermediate 1 [1,1-di(t-butyl 2-methyl-5-cyclohexylphenyl-4-oxymethylcarboxylate)-1-(t-butyl phenyl-2-oxymethylcarboxylate)methane (chemical Formula (7))]

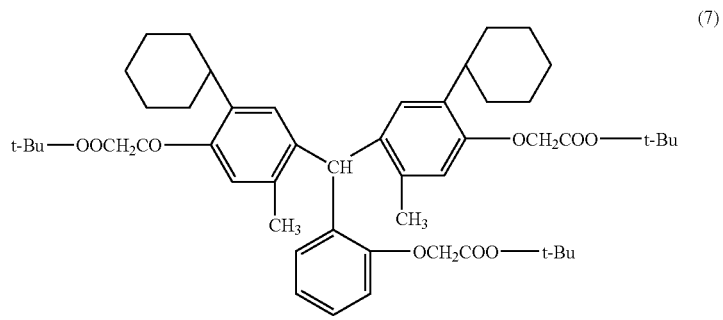

(7)

A 5 liter four-neck flask equipped with a stirrer, a thermometer, a dropping funnel, and a reflux condenser was charged with 726 g (1.5 mols) of 1,1-di(2-methyl-4-hydroxy-5-cyclohexylphenyl)-1-(2-hydroxyphenyl)methane, 829 g (6.0 mols) of potassium carbonate, and 2179 g of dimethylformamide, and following flushing of the flask with nitrogen gas, the temperature was raised to 100° C. with constant stirring to dissolve the solid components. With the temperature maintained, 720 g (4.77 mols) of t-butyl chloroacetate was then added dropwise over a period of 2 hours. The resulting mixture was then stirred for a further 20 hours at the same temperature.

Following completion of the reaction, the reaction product mixture was cooled, the potassium salt was filtered off, and toluene and water were added to the filtrate. Following washing with the water, the aqueous phase was removed, and methanol was added to the organic phase to precipitate crystals, which were collected by filtration and then dried, yielding 1162 g (purity 98%, yield 90%) of the target product. The purity and yield of the target product were determined using gas chromatography and liquid chromatography analyses (this also applies to following purity and yield values). Furthermore, mass spectrometry and proton NMR analyses were used to confirm that the target product was 1,1-di(t-butyl 2-methyl-5-cyclohexylphenyl-4-oxymethylcarboxylate)-1-(t-butyl phenyl-2-oxymethylcarboxylate)methane, as represented by the above chemical formula (7).

Synthesis of the Intermediate 2 [1,1-di(2-methyl-5-cyclohexylphenyl-4-oxymethylcarboxylic acid)-1-(phenyl-2-oxymethylcarboxylic acid)methane (chemical Formula (8))]

(8)

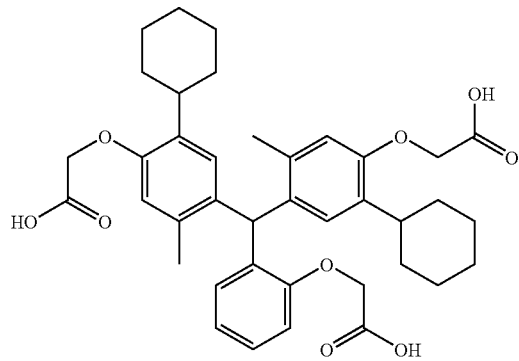

A 2 liter four-neck flask equipped with a stirrer, a thermometer, a dropping funnel, and a reflux condenser was charged with 421 g (0.5 mols) of the intermediate 1 (chemical formula (7)) obtained above, 84.2 g (0.44 mols) of para-toluenesulfonic acid, and 660 g of methyl isobutyl ketone, and following flushing of the flask with nitrogen gas, the reaction mixture was stirred for 8 hours at 110° C. to allow the reaction to proceed. Following completion of the reaction, 200 g of water was added to the reaction product mixture under constant stirring. Following thorough washing with water, the aqueous phase was removed, a portion of the solvent was removed by distillation from the organic phase, and then toluene was added, thus generating a precipitate. The precipitated crystals were collected by filtration and dried, yielding 302 g (a yield of 85.5% relative to the starting carboxylic acid) of the target product as a white solid with a purity of 98.0% (as determined by high performance liquid chromatography).

Mass spectrometry and proton NMR analyses were used to confirm that the target product was 1,1-di(2-methyl-5-cyclohexylphenyl-4-oxymethylcarboxylic acid)-1-(phenyl-2-oxymethylcarboxylic acid)methane, as represented by the above chemical formula (8). The melting point (determined by differential thermal analysis) was 126.7° C., and the molecular weight (determined by mass spectrometry) was 658.8 (M+).

Synthesis of the Compound Represented by the Chemical Formula (3)

46.1 g (0.07 mols) of the intermediate 2 obtained above (chemical formula (8)) (IUPAC name: 2-(4-({[4-carboxymethoxy]-5-cyclohexyl-2-methylphenyl}[2-(carboxymethoxy)phenyl]methyl)-2-cyclohexyl-5-methylphenoxy)acetic acid), and 89.3 g (0.7 mols) of 1-ethylcyclohexan-1-ol were dissolved in 57.9 g of pyridine at 80° C., and a solution containing 133.4 g (0.7 mols) of p-toluenesulfonyl chloride dissolved in 120 g of pyridine was then added dropwise over a three hour period to effect a reaction. The reaction was then continued by stirring the mixture for 3 hours at 80° C., and 140 g of cyclohexane and 343.5 g of water were then added to the reaction mixture. The phases were allowed to separate and the aqueous phase, weighing 464.6 g, was removed. A further 70 g of water was then added, and the mixture was stirred for 30 minutes at 60° C., before the phases were again allowed to separate, and the aqueous phase, weighing 66.7 g, was removed. The remaining organic phase was concentrated using an evaporator, and the concentrated residue was purified by silica gel column chromatography (using cyclohexane:acetonitrile:triethylamine=9:0.9:0.1 (weight ratio) as the eluting solvent), thus yielding 15.0 g of the target product (a faint yellow, transparent liquid).

Figure 2:
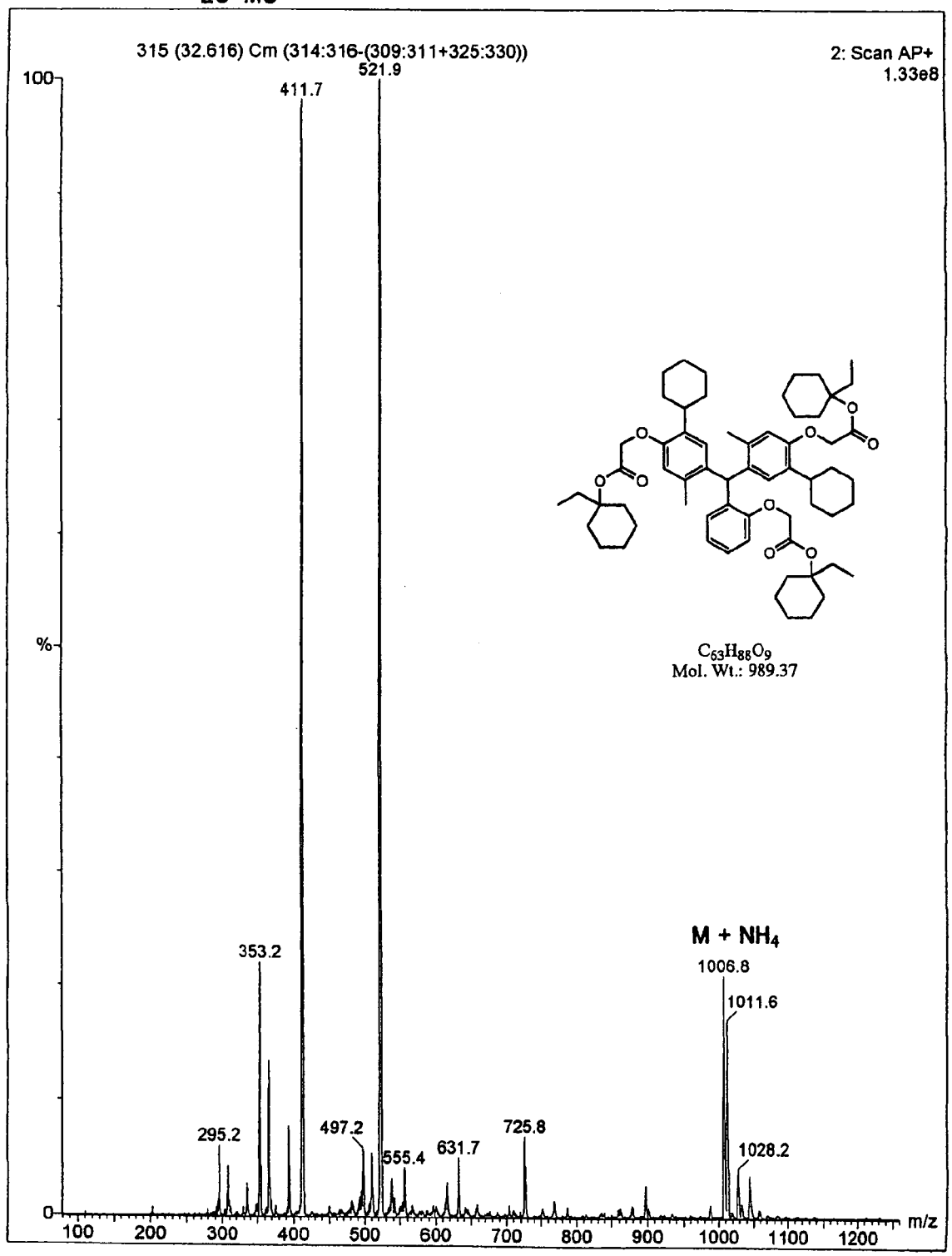
FIG. 2 is a chart showing the results of high-performance liquid chromatography analysis of an example according to the present invention.
Figure 3:
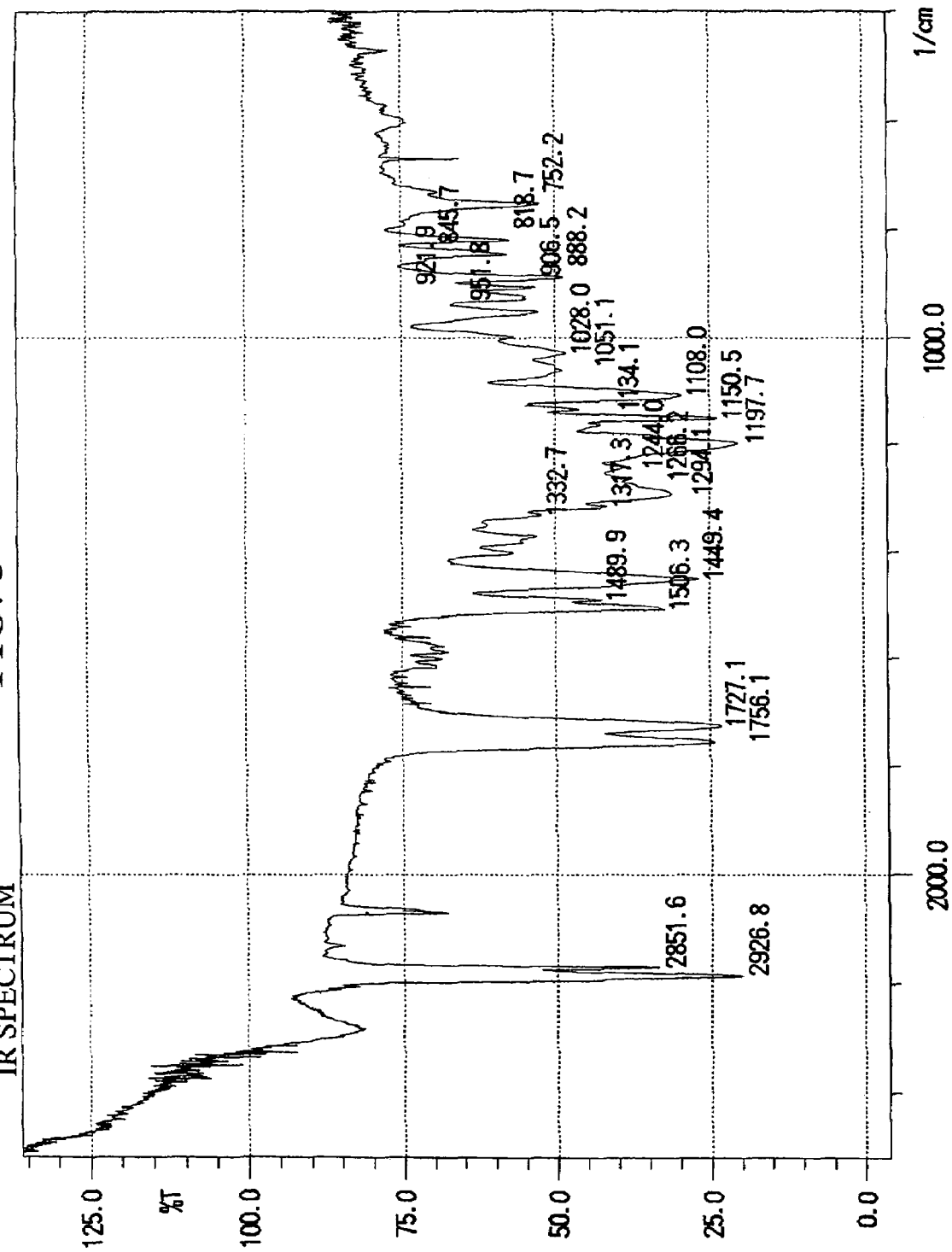
FIG. 3 is a chart showing the results of infrared spectroscopic analysis of an example according to the present invention.

Mass spectrometry and proton NMR analyses were used to confirm that the target product was 2-{2-cyclohexyl-4-[(5-cyclohexyl-4-{[(ethylcyclohexyl)oxycarbonyl]methoxy}-2-methylphenyl) (2-{[(ethylcyclohexyl)oxycarbonyl]methoxy}phenyl)methyl]-5-methylphenoxy}acetate, as represented by the above chemical formula (3). The purity was 99.2% (as determined by high performance liquid chromatography), and the yield was 21.7%. The results of proton nuclear magnetic resonance analysis are shown in FIG. 1, the following formula (9), and Table 1. The results of high-performance liquid chromatography analysis are shown in FIG. 2, and the results of infrared spectroscopic analysis are shown in FIG. 3.

TABLE 1

(9)

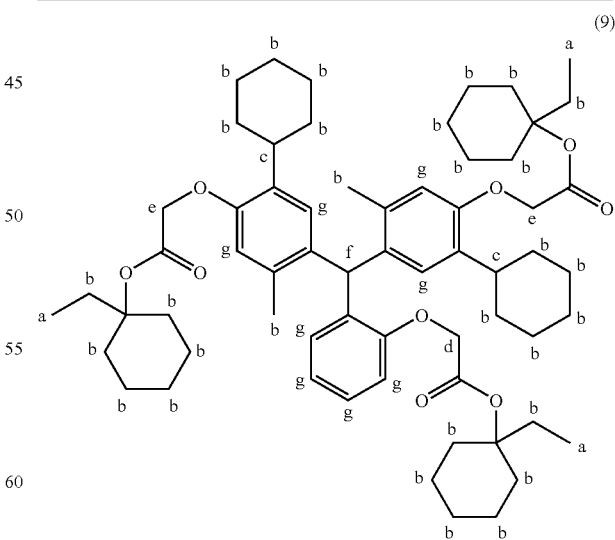

| Shift value (ppm) | Number of protons | Signal | Signal origin |
|---|---|---|---|
| 0.7 | 9 | dd | a (—CH$_3$) |
| 1.1 to 2.1 | 62 | m | b (—CH$_2$, —CH$_3$) |

TABLE 1-continued (9)

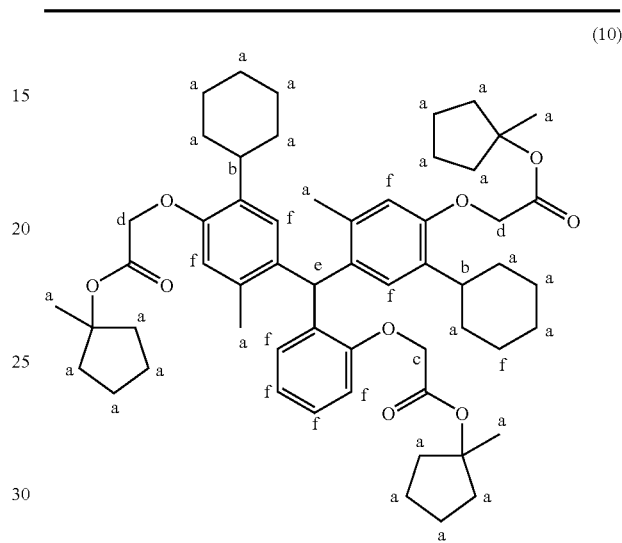

| Shift value (ppm) | Number of protons | Signal | Signal origin |
|---|---|---|---|
| 2.8 | 2 | dd | c (—CH—) |
| 4.6 | 2 | s | d (—CH$_2$—) |
| 4.7 | 4 | s | e (—CH$_2$—) |
| 6.0 | 1 | s | f (—CH—) |
| 6.6 to 7.2 | 8 | m | g (Ph-H) |

SYNTHESIS EXAMPLE 1

Synthesis of the Compound Represented by the Chemical Formula (6)

A 2 liter four-neck flask equipped with a stirrer, a thermometer, a dropping funnel, and a reflux condenser was charged with 46.1 g (0.07 mols) of the intermediate 2 (chemical formula (8)) obtained in the same manner as described above in the example 1, 25.2 g (0.252 mols) of 1-methylcyclopentan-1-ol, 6.9 g of dimethylformamide, and 57.9 g of pyridine, and following flushing of the flask with nitrogen gas, the temperature was raised to 60° C. with constant stirring to dissolve the solid components. With the temperature maintained, a solution containing 66.7 g (0.35 mols) of p-toluenesulfonyl chloride dissolved in 66.7 g of pyridine was then added dropwise over a period of 1 hour, and the resulting mixture was then stirred for a further 3 hours at the same temperature.

Following completion of the reaction, 343.5 g of tetramethylammonium hydroxide was added to the reaction product mixture, and following thorough stirring, heptan-2-one was added and stirred, and the aqueous phase was separated and removed. Toluene and water were added to the thus obtained organic phase, and following thorough stirring at 60° C., the aqueous phase was once again separated and removed. A portion of the solvent was then removed by distillation from the organic phase, and then isopropanol was added, thus generating a precipitate. The precipitated crystals were collected by filtration and dried, yielding 32.5 g of the target material as a white colored solid.

Mass spectrometry and proton NMR analyses were used to confirm that the target product was 1,1-di(2-methyl-5-cyclohexylphenyl-4-oxymethylcarboxy(1-methyl-cyclopentane))-1-(phenyl-2-oxymethylcarboxy(1-methyl-cyclopentane))methane, as represented by the above chemical formula (6). The purity, as determined by high performance liquid chromatography, was 99.6%, and the yield relative to the starting carboxylic acid was 51.3%. The melting point (determined by differential thermal analysis) was 89.3° C., and the molecular weight (determined by mass spectrometry) was 905.2 (M+). The results of proton nuclear magnetic resonance analysis (400 MHz, solvent: DMSO-d (dimethyl sulfoxide-d$_6$ (deuterized solvent)) are shown in formula (10) below, and Table 2.

TABLE 2

(10)

| δ (ppm) | Number of protons | Signal | Signal origin |
|---|---|---|---|
| 1.1 to 2.2 | 59 | m | a (—CH$_2$, —CH$_3$) |
| 2.9 | 2 | T | b (—CH—) |
| 4.3 | 2 | S | c (—CH$_2$—) |
| 4.5 | 4 | S | d (—CH$_2$—) |
| 6 | 1 | S | e (—CH—) |
| 6.4 to 7.3 | 8 | M | f (Ph-H) |

EXAMPLE 2

A positive resist composition was prepared.

First, the component (A) was prepared. Namely, p-hydroxystyrene (Mw=15,000) and ethyl vinyl ether were reacted together in the presence of an acid catalyst using a conventional method, thus forming a resin in which 30 mol % of the hydroxyl groups within the p-hydroxystyrene had been protected with 1-ethoxyethyl groups, and this resin was used as the component (A).

100 parts by weight of this component (A) was combined with 4.0 parts by weight of bis(cyclohexylsulfonyl)diazomethane and 4.0 parts by weight of bis(t-butylsulfonyl) diazomethane as the component (B), 2 parts by weight of 1,1-di(2-methyl-5-cyclohexylphenyl-4-oxymethylcarboxy (1-methyl-cyclopentane))-1-(phenyl-2-oxymethylcarboxy (1-methyl-cyclopentane))methane, as obtained in the above synthesis example 1, and as represented by the above chemical formula (6), as the component (C), 0.14 parts by weight of triisopropanolamine as the component (D), 6 parts by weight of benzophenone (manufactured by Tokyo Kasei Kogyo Co., Ltd.) and 6 parts by weight of a trisphenol compound represented by a chemical formula (11) shown below, wherein the 3 hydroxyl groups have been protected with 5-naphthoquinonediazidesulfonyl groups, as dyes, and 0.05 parts by weight of the commercial product XR-104

(manufactured by Dainippon Ink and Chemicals, Incorporated) as a surfactant were dissolved in 900 parts by weight of a mixed solvent of PGMEA and EL (with a weight ratio PGMEA:EL of 6:4), thus yielding a positive resist composition.

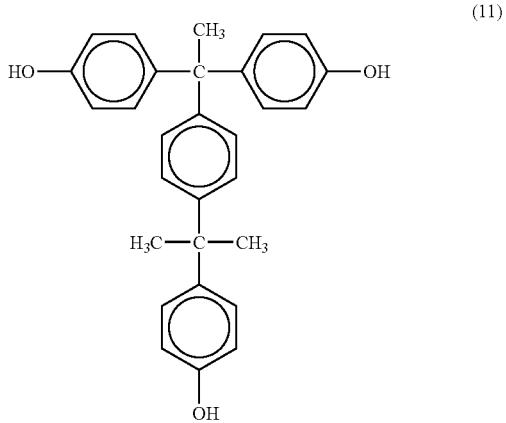

The thus obtained positive resist composition was used to form a resist pattern.

The positive resist composition was applied to the surface of a Si substrate, which had been surface treated with hexamethyldisilazane (HMDS), using a spinner. The composition was then prebaked and dried on a hotplate at 90° C. for 60 seconds, forming a resist layer with a film thickness of 380 nm.

This layer was then selectively irradiated with a KrF excimer laser (248 nm) through a C.O.G. mask (chrome on glass mask), using a KrF exposure apparatus NSR-S203B (manufactured by Nikon Corporation, NA (numerical aperture)=0.65, σ=0.78).

The irradiated resist was then subjected to PEB treatment at 110° C. for 60 seconds, subsequently subjected to puddle development for 30 seconds at 23° C. in a 2.38% by weight aqueous solution of tetramethylammonium hydroxide, and then rinsed by washing for 30 seconds with pure water. The resist was then shaken dry, and then further dried by heating at 100° C. for 60 seconds, thus forming a resist pattern.

Inspection of the thus obtained resist pattern under a scanning electron microscope (measuring SEM S-9200) manufactured by Hitachi Ltd. revealed a resolved line and space pattern of 180 nm. No developing defects such as scum were detected. Measurement of the exposure dose (Eop, units: $mJ/cm^2$) required to faithfully reproduce a 180 nm line and space pattern revealed a sensitivity of 16.0 $mJ/cm^2$.

COMPARATIVE EXAMPLE 1

With the exception of excluding the component (C), a positive resist composition was prepared in the same manner as the example 2, and this positive resist composition was used to form a resist pattern. Evaluation of the resist pattern in the same manner as above revealed that although a 180 nm line and space pattern was able to be resolved, scum and other defects were visible on the resist pattern. The sensitivity was 15.5 $mJ/cm^2$.

From these results it is evident that by adding the compound (C), the occurrence of scum and other defects can be suppressed, while maintaining a high sensitivity.

Particularly in those cases where, as in the example 2 and the comparative example 1, a dye is added to the positive resist composition, the low molecular weight dye is prone to sublimation as a result of the heating conducted during resist pattern formation, and the resulting sublimate can easily adhere to the resist pattern, causing scum, but in the example 2, the occurrence of such scum was effectively prevented.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A positive resist composition comprising:
   a resin component (A) which contains an acid dissociable dissolution inhibiting group and displays increased alkali solubility under action of acid;
   an acid generator component (B) that generates acid on exposure; and
   a compound (C) represented by a general formula (1) shown below:

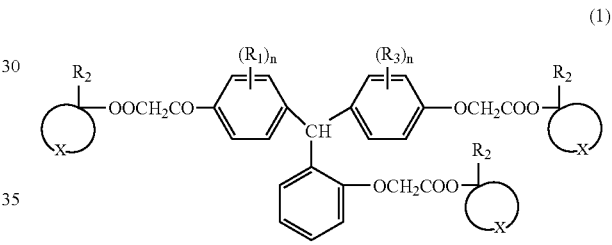

(wherein, each $R_1$ group and each $R_3$ group represents, independently, a hydrogen atom, an alkyl group of 1 to 3 carbon atoms, or a cycloalkyl group of 4 to 6 carbon atoms, provided at least one of said $R_1$ and $R_3$ groups is a cycloalkyl group of 4 to 6 carbon atoms, n represents an integer from 1 to 3, $R_2$ represents an alkyl group of 1 to 3 carbon atoms, and X represents an alkylene group of either 4 or 5 carbon atoms).

2. A positive resist composition according to claim 1, further comprising: a nitrogen-containing organic compound (D).

3. A compound represented by a general formula (2) shown below:

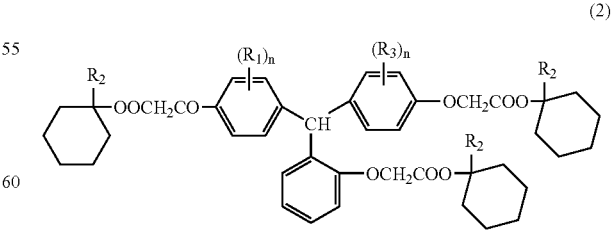

(wherein, each $R_1$ group and each $R_3$ group represents, independently, a hydrogen atom, an alkyl group of 1 to 3 carbon atoms, or a cycloalkyl group of 4 to 6 carbon atoms, provided at least one of said $R_1$ and $R_3$ groups is a cycloalkyl group of 4 to 6 carbon atoms, n represents an integer from 1 to 3, and $R_2$ represents an alkyl group of 1 to 3 carbon atoms).

4. The positive resist composition according to claim 1, wherein in the compound (C), X forms a cyclohexyl group in combination with the carbon atom to which the $R_2$ group is bonded.

5. The positive resist composition according to claim 1, wherein in the compound (C), $R_1$ and $R_3$ are selected from the group consisting of methyl groups, ethyl groups, n-propyl groups, isopropyl groups, and cyclohexyl groups.

6. The positive resist composition according to claim 1, wherein in the compound (C), n is 2.

7. The positive resist composition according to claim 1, wherein in the compound (C), $R_2$ is selected from the group consisting of methyl groups, ethyl groups, n-propyl groups and isopropyl groups.

8. The positive resist composition according to claim 1, wherein the component (C) derives organic carboxylic acids under action of acid derived from the component (B) on exposure.

9. The positive resist composition according to claim 1, wherein the acid dissociable dissolution inhibiting group in the component (A) is selected from the group consisting of tertiary alkyl groups, chain-like alkoxyalkyl groups, tertiary alkyloxycarbonyl groups, tertiary alkyloxycarbonylalkyl groups, and cyclic ether groups.

10. The positive resist composition according to claim 1, wherein the component (B) is selected from the group consisting of onium salt-derived acid generators, oxime sulfonate-derived acid generators, diazomethane-derived acid generators, iminosulfonate-derived acid generators, and disulfone-derived acid generators.

11. The positive resist composition according to claim 1, wherein the component (C) is contained in an amount of 0.1 to 20 parts by weight per 100 parts of the component (A).

12. A resist pattern comprising the positive resist composition of claim 1, wherein exposed portions are soluble in alkali and unexposed portions are insoluble in alkali.

* * * * *